(12) United States Patent
Ko et al.

(10) Patent No.: US 8,144,299 B2
(45) Date of Patent: Mar. 27, 2012

(54) THIN FILM TRANSISTOR FOR DRIVING GATE LINE AND LIQUID CRYSTAL DISPLAY HAVING THE SAME

(75) Inventors: Gwang-Bum Ko, Asan-si (KR);
Ho-Kyoon Kwon, Seoul (KR);
Byoung-Sun Na, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 875 days.

(21) Appl. No.: 12/172,579

(22) Filed: Jul. 14, 2008

(65) Prior Publication Data
US 2009/0122213 A1    May 14, 2009

(30) Foreign Application Priority Data
Nov. 13, 2007    (KR) .................. 10-2007-0115626

(51) Int. Cl.
*G02F 1/1345*    (2006.01)
*G09G 3/36*    (2006.01)
(52) U.S. Cl. ......... 349/149; 349/151; 349/152; 345/100
(58) Field of Classification Search .................. 349/149, 349/151, 152; 345/92, 94, 100
See application file for complete search history.

(56) References Cited

U.S. PATENT DOCUMENTS
2005/0275609 A1 * 12/2005 Lee et al. .................. 345/82
* cited by examiner

*Primary Examiner* — Michael Caley
(74) *Attorney, Agent, or Firm* — Cantor Colburn LLP

(57) ABSTRACT

A thin film transistor for driving a gate line and a liquid crystal display having the same are provided. The thin film transistor for driving a gate line includes a gate electrode, a semiconductor layer formed on the gate electrode, a drain electrode formed on the semiconductor layer, a source electrode formed on the semiconductor layer and separated from the drain electrode and being coupled to the gate line, and a ripple-prevention electrode formed on the drain electrode which overlaps at least a part of the drain electrode.

20 Claims, 13 Drawing Sheets

THIN FILM TRANSISTOR FOR DRIVING GATE LINE AND LIQUID CRYSTAL DISPLAY HAVING THE SAME

This application claims priority to Korean Patent Application No. 10-2007-0115626, filed on Nov. 13, 2007, and all of the benefits accruing therefrom under 35 U.S.C. §119, the contents of which in its entirety are herein incorporated by reference.

BACKGROUND OF THE INVENTION

1. Field of the Invention

The present invention relates to a thin film transistor for driving a gate line and a liquid crystal display having the same.

2. Description of the Related Art

Although a liquid crystal display ("LCD") device includes a gate driving integrated circuit ("IC") which is packaged by a TCP (Tape-Carrier-Package) or COG (Chip-On-Glass) method, other packaging methods have been sought in consideration of the manufacturing cost, size and design of a product. A gate-driving unit which generates a gate signal using an amorphous silicon thin film transistor ("a-Si TFT"), without adopting the gate driving IC, is packaged onto a glass substrate.

The a-Si TFT receives a clock signal, and is turned on for a specified time in a frame to output a high-level clock signal as a gate signal and the a-Si TFT should be in a turned-off state for a remaining time.

However, the a-Si TFT may not be in a turned-off state for the remaining time due to parasitic capacitance. Thus, the display quality of the liquid crystal display deteriorates.

BRIEF SUMMARY OF THE INVENTION

Accordingly, the present invention has been made in an effort to solve the above-stated problem, and aspects of the present invention provide a thin film transistor for driving a gate line, which can improve the display quality of a liquid crystal display, and a liquid crystal display which can improve the display quality.

According to an exemplary embodiment, the present invention provides a thin film transistor for driving a gate line, which includes a gate electrode, a semiconductor layer formed on the gate electrode, a drain electrode formed on the semiconductor layer; a source electrode formed on the semiconductor layer and separated from the drain electrode and being coupled to the gate line, and a ripple-prevention electrode formed on the drain electrode which overlaps at least a part of the drain electrode.

In another exemplary embodiment, the present invention provides a liquid crystal display which includes a plurality of gate lines, and a plurality of thin film transistors coupled to the respective gate lines to successively output a plurality of gate signals. Each of the thin film transistors includes a gate electrode, a semiconductor layer formed on the gate electrode, a drain electrode formed on the semiconductor layer, a source electrode formed on the semiconductor layer in separation from the drain electrode, the source electrode being coupled to the respective gate lines to output the gate signals, and a ripple-prevention electrode formed on the drain electrode and overlapping at least a part of the drain electrode.

BRIEF DESCRIPTION OF THE DRAWINGS

The above and other aspects, features and advantages of the present invention will be apparent from the following detailed description when taken in conjunction with the accompanying drawings, in which.

DETAILED DESCRIPTION OF THE INVENTION

Figure 1:
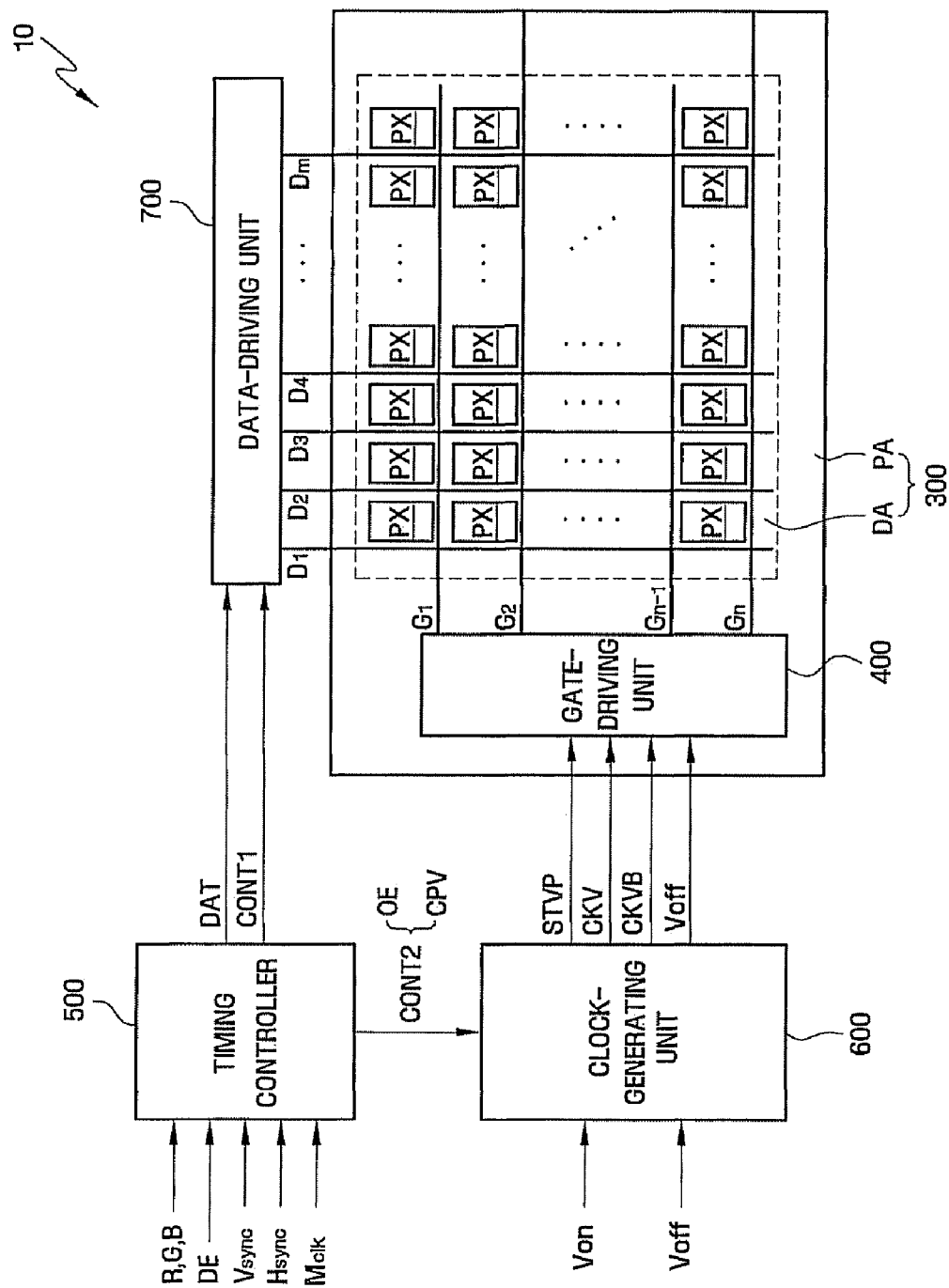
FIG. 1 is a block diagram of an exemplary embodiment of a thin film transistor for driving a gate line and a liquid crystal display having the same according to the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Also, since a drain (or drain electrode) and a source (or source electrode) may be named differently according to the direction of current, an element called a drain or drain electrode hereinafter may operate as a source or source electrode, and an element called a source or source electrode may operate as a drain or drain electrode. Accordingly, an element called a drain or drain electrode is not limited to the drain or drain electrode. Also, the element called the source or source electrode is not limited to the source or source electrode.

Figure 2:
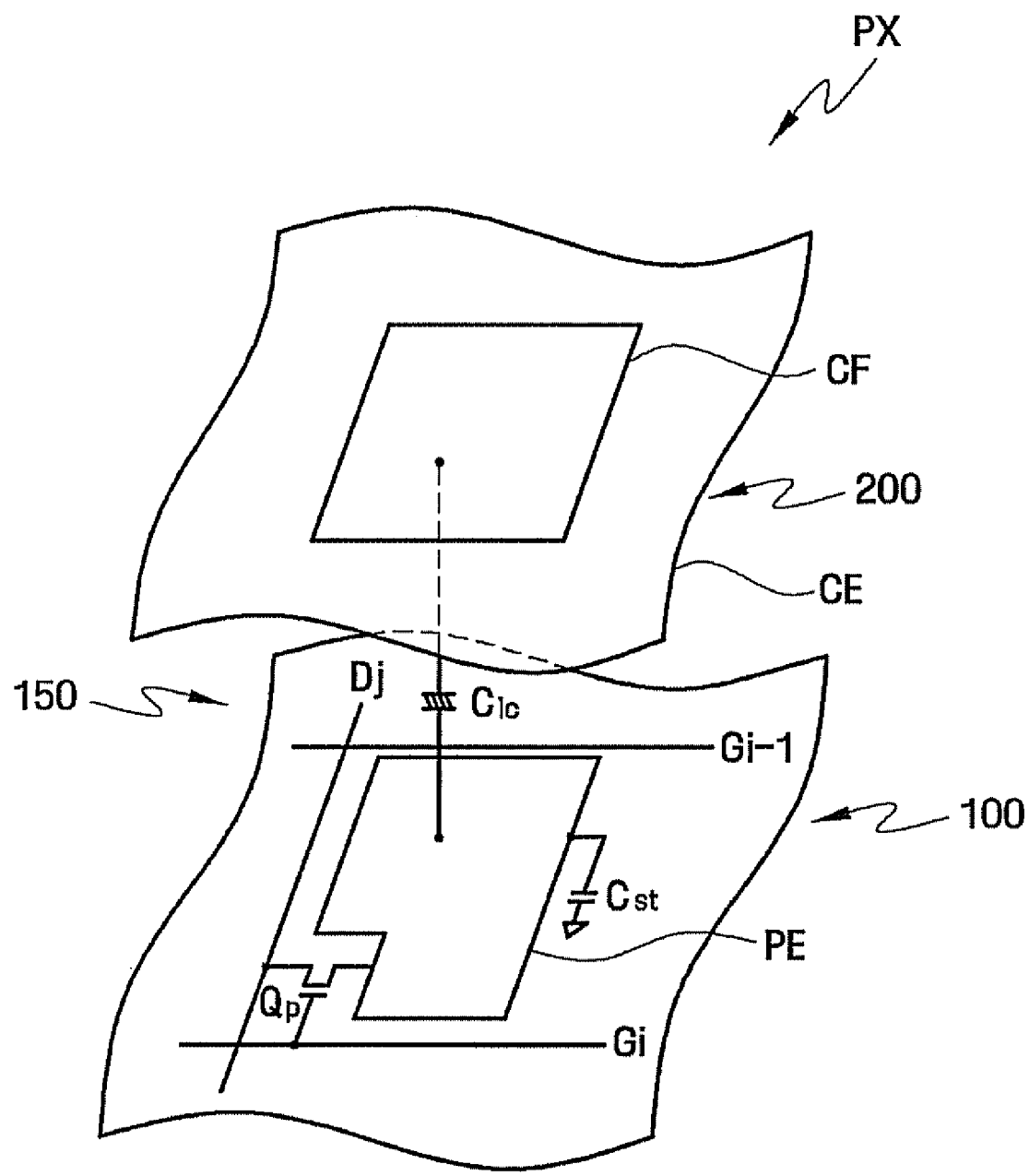
FIG. 2 is an equivalent circuit diagram of an exemplary embodiment of one pixel of FIG. 1 according to the present invention.
Figure 3:
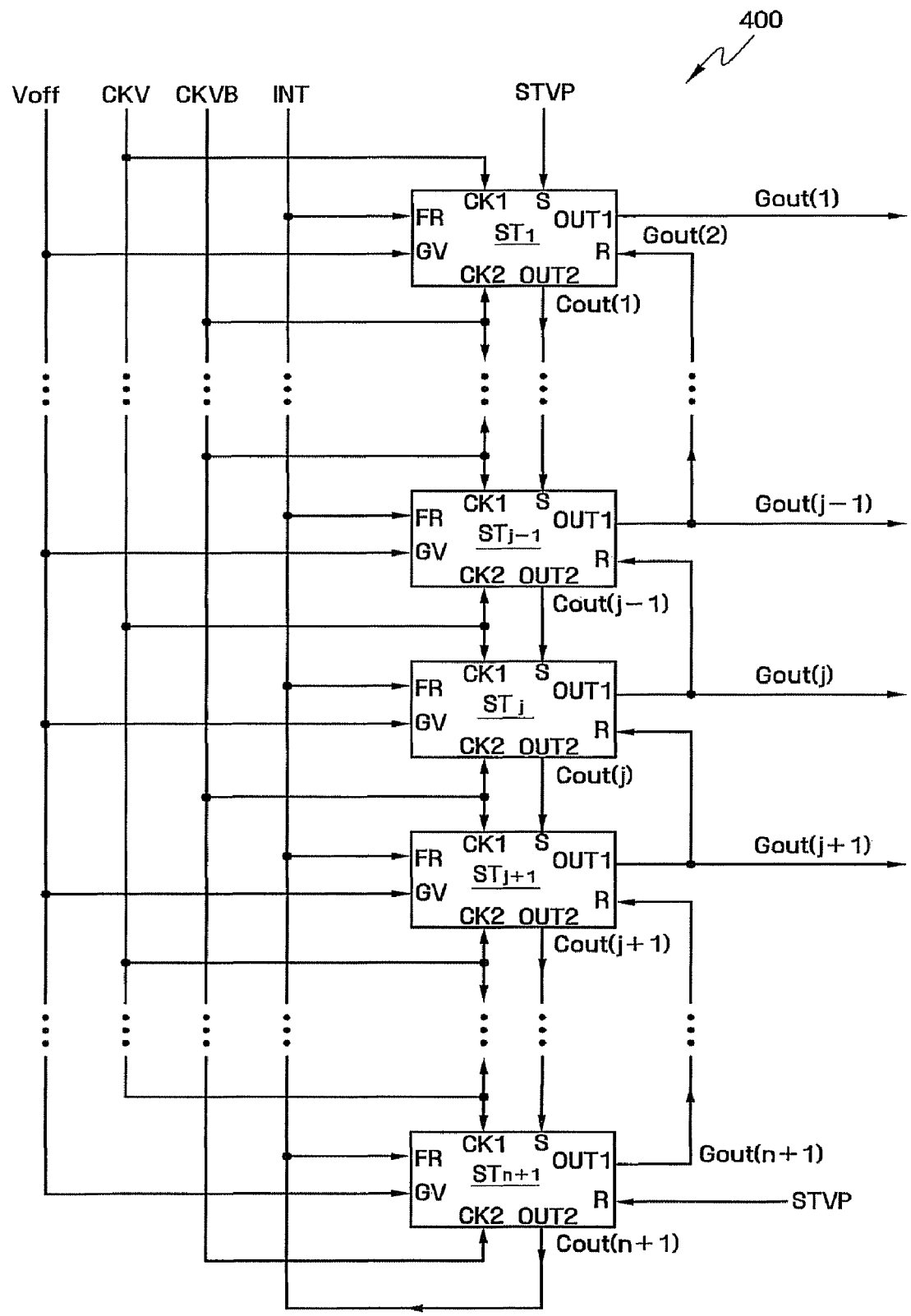
FIG. 3 is a block diagram of an exemplary embodiment of the gate-driving unit of FIG. 1 according to the present invention.
Figure 4:
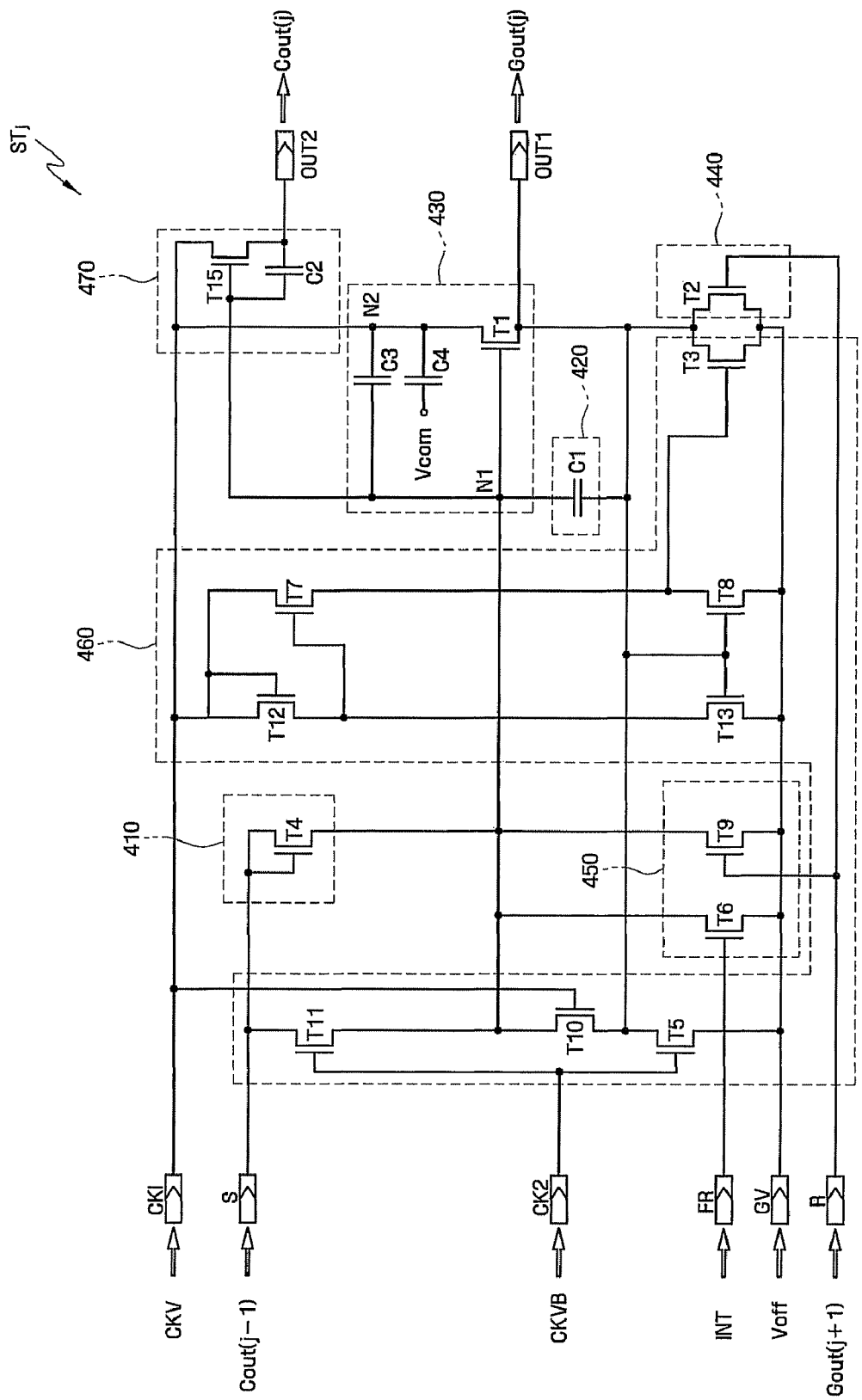
FIG. 4 is a circuit diagram of an exemplary embodiment of the j-th stage of FIG. 3 according to the present invention.
Figure 5:
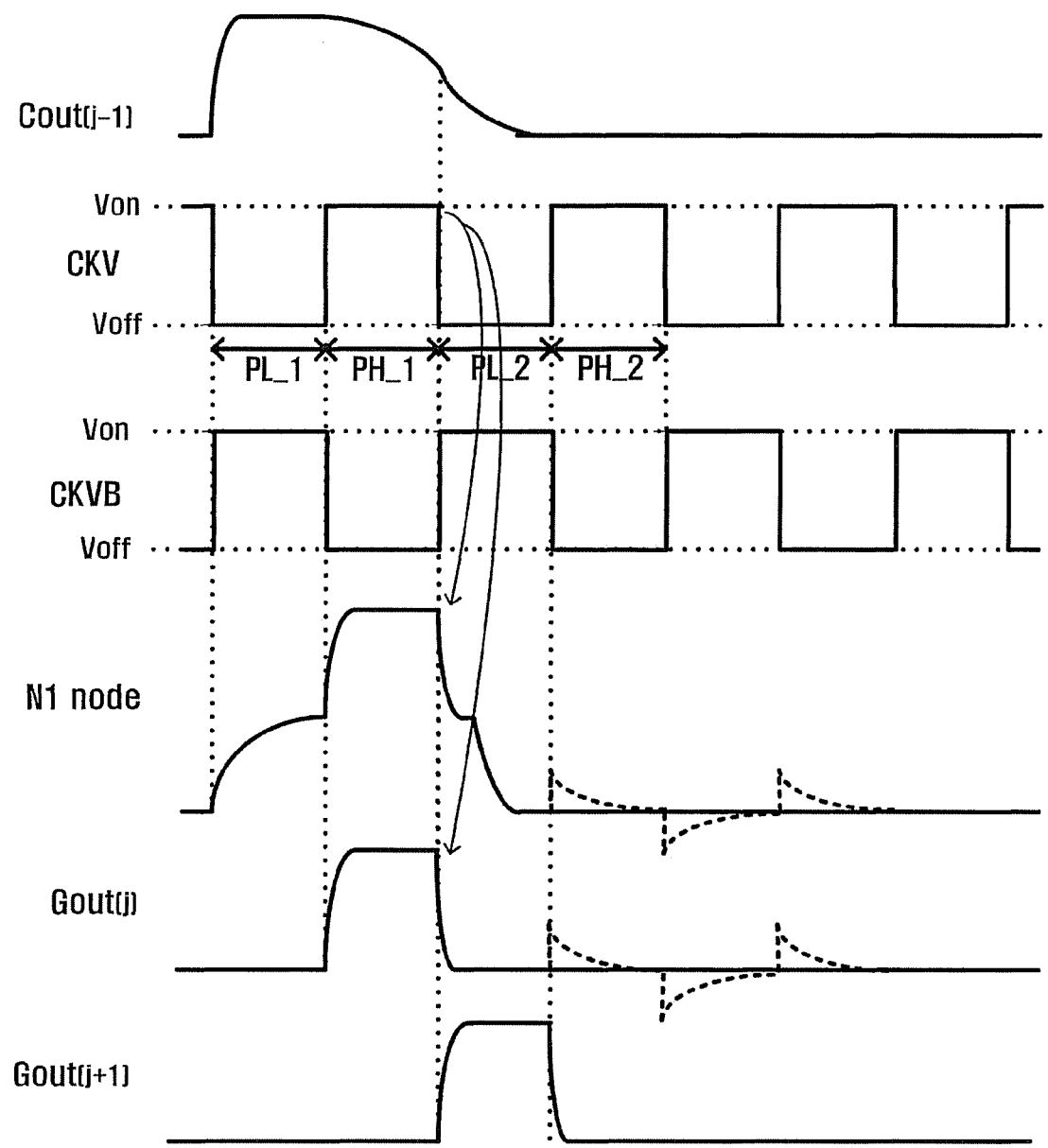
FIG. 5 is a signal waveform diagram of an exemplary embodiment of the operation of the j-th stage according to the present invention.
Figure 6:
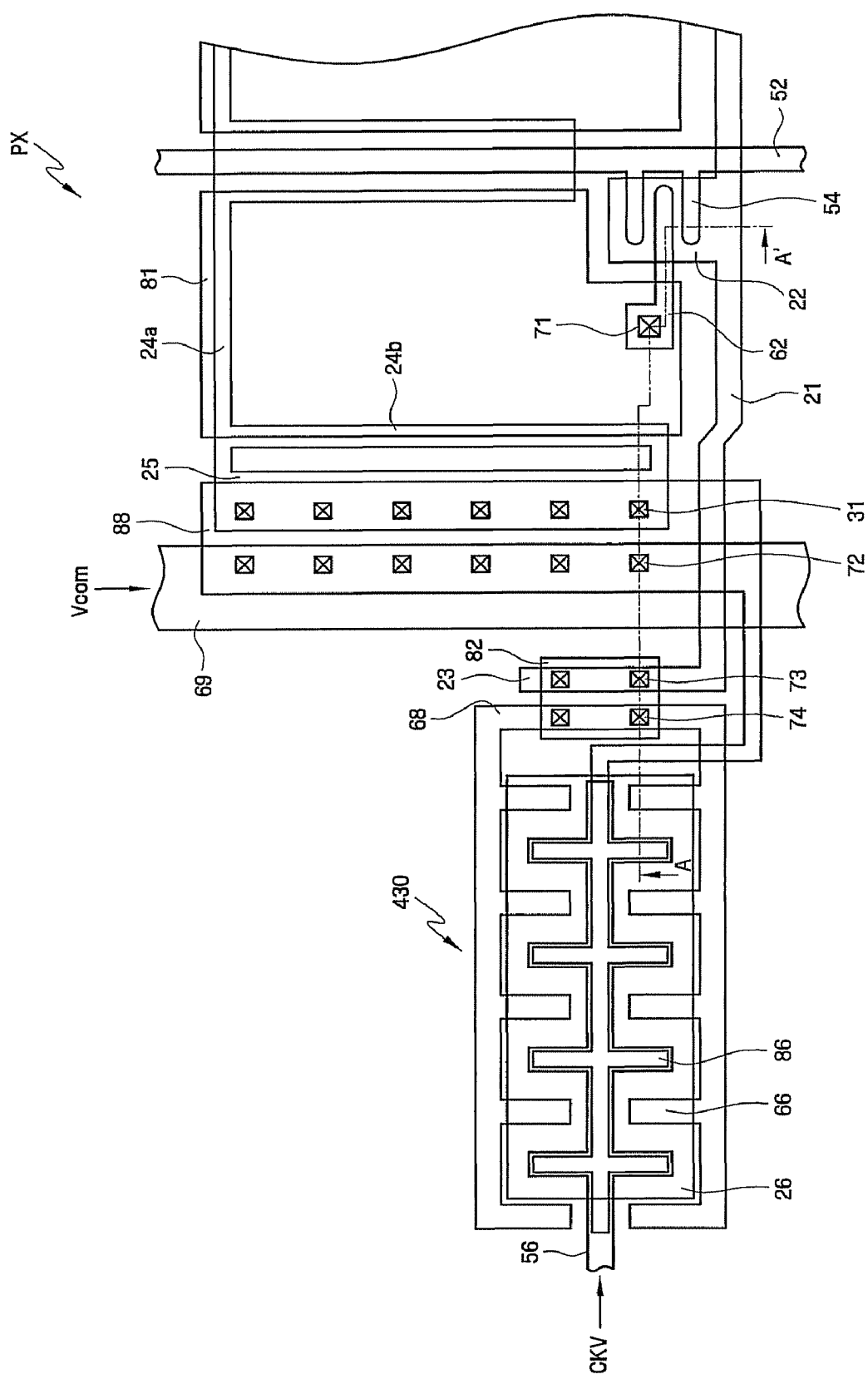
FIG. 6 is a layout diagram of an exemplary embodiment of a pull-up unit of the j-th stage and pixels according to the present invention.

Referring to FIGS. 1 through 6, a thin film transistor for driving a gate line and a liquid crystal display having the same according to an embodiment of the present invention will be described. FIG. 1 is a block diagram of an exemplary embodiment of a thin film transistor for driving a gate line and a liquid crystal display having the same according to the present invention. FIG. 2 is an equivalent circuit diagram of an exemplary embodiment of one pixel of FIG. 1, and FIG. 3 is a block diagram of an exemplary embodiment of the gate-driving unit of FIG. 1. FIG. 4 is a circuit diagram of an exemplary embodiment of the j-th stage of FIG. 3, FIG. 5 is a signal waveform diagram of an exemplary embodiment of the operation of the j-th stage, and FIG. 6 is a layout diagram of an exemplary embodiment a pull-up unit of the j-th stage and a pixel.

Referring to FIG. 1, a liquid crystal display 10 according to an exemplary embodiment of the present invention includes a liquid crystal display ("LCD") panel 300, a timing controller 500, a clock-generating unit 600, a gate-driving unit 400, and a data-driving unit 700.

The LCD panel 300 is divided into a display area DA in which an image is displayed and a non-display area PA in which no image is displayed.

According to an exemplary embodiment, the display area DA, which displays an image, includes a first substrate 100 on which a plurality of gate lines G1 to Gn, a plurality of data lines D1 to Dm, a pixel-switching element Qp, and a pixel electrode PE are formed, a second substrate 200 on which a color filter CF and a common electrode CE are formed, and a liquid crystal layer 150 interposed between the first substrate 100 and the second substrate 200. The gate lines G1 to Gn extend in a row direction, and are in parallel with one another. The data lines D1 to Dm extend in a column direction, and are in parallel with one another.

The pixel of FIG. 1 will be described with reference to FIG. 2. A color filter CF is formed on a partial area of a common electrode CE of the second substrate 200 to face a pixel electrode PE of the first substrate 100. As shown, a pixel PX connected to the i-th (i=1~n) gate line Gi and the j-th (j=1~m) data line Dj includes a pixel-switching element Qp connected to signal lines Gi and Dj, a liquid crystal capacitor Clc and a storage capacitor Cst connected to the pixel-switching element Qp. A common voltage is applied to one end of the storage capacitor Cst and the common electrode CE.

The non-display area PA is an area in which no image is displayed since the first substrate 100 shown in FIG. 2 is wider than the second substrate 200 shown in FIG. 2.

The timing controller 500 receives input control signals such as a horizontal sync signal Hsync, a main clock signal Mclk, a data enable signal DE, and so forth, and outputs a first control signal CONT1. Here, the first control signal CONT1 is a signal which controls the operation of the data-driving unit 700, and includes a horizontal start signal which starts the operation of the data-driving unit 700, and a load signal which commands the output of two data voltages.

Accordingly, the data-driving unit 700 receives an image signal DAT and the first control signal CONT1, and provides an image data voltage which corresponds to the image signal DAT to the respective data lines D1 to Dm. The data-driving unit 700 is an IC which is connected to the LCD panel 300 in the form of a tape carrier package ("TCP"). According to an exemplary embodiment, the data-driving unit 700 may also be formed on the non-display area of the LCD panel 300.

In addition, the timing controller 500 provides a second control signal CONT2 to the clock-generating unit 600. The clock-generating unit 600 receives the second control signal CONT2, and outputs a clock signal CKV and a clock bar signal CKVB. That is, the clock-generating unit 600 is controlled by the second control signal CONT2, and outputs the clock signal CKV and the clock bar signal CKVB using a gate-on voltage Von and a gate-off voltage Voff. In the current exemplary embodiment, the second control signal CONT2 includes an output enable signal OE and a gate clock signal CPV. The clock signal CKV and the clock bar signal CKVB are pulse signals that swing the gate-on voltage Von and the gate-off voltage Voff, respectively, and the clock signal CKV includes a phase opposite to that of the clock bar signal CKVB.

The gate-driving unit 400 is enabled by a scan start signal STVP, generates a plurality of gate signals using the clock signal CKV, the clock bar signal CKVB, and the gate-off voltage Voff, and successively provides the gate signals to the respective gate lines G1 to Gn. The details of the gate-driving unit 400 will now be described with reference to FIG. 3.

Referring to FIG. 3, the gate-driving unit 400 includes a plurality of stages $ST_1$ to $ST_{N+1}$. The respective stages $ST_1$ to $ST_N$ except for the last stage $ST_{N+1}$ are connected to the gate lines G1 to Gn in a one-to-one manner, and output the gate signals $Gout_1$ to $Gout_{(n)}$. The respective stages $ST_1$ to $ST_{N+1}$ receive the gate-off voltage Voff, the clock signal CKV, the clock bar signal CKVB, and an initialization signal INT. In the current exemplary embodiment, the initialization signal INT can be provided from the clock-generating unit 600 or the timing controller 500.

Each of the respective stages $ST_1$ to $ST_{N+1}$ includes a first clock terminal CK1, a second clock terminal CK2, a set terminal S, a reset terminal R, a supply voltage terminal GV, a frame reset terminal FR, a gate output terminal OUT1, and a carry output terminal OUT2.

As shown in FIG. 3, according to an exemplary embodiment, a carry signal $Cout_{(j-1)}$ of the preceding stage $ST_{j-1}$ is inputted to the set terminal S of the j-th stage $ST_j$ connected to the j-th (j≠1) gate line, and the gate signal $Gout_{(j+1)}$ of the following stage $ST_{j+1}$ is inputted to the reset terminal R. Also, the clock signal CKV and the clock bar signal CKVB are inputted to the first clock terminal CK1 and the second clock terminal CK2, respectively, and the gate-off voltage Voff is inputted to the supply voltage terminal GV. The initialization signal INT or the carry signal $Cout_{(n+1)}$ of the last stage $ST_{n+1}$ is inputted to the frame reset terminal FR. The gate output terminal OUT1 outputs the gate signal $Gout_{(j)}$, and the carry output signal OUT2 outputs the carry signal $Cout_{(j)}$.

However, according to an exemplary embodiment, the scan start signal STVP is inputted to the first stage $ST_1$ instead of the preceding carry signal, and the scan start signal STVP is inputted to the last stage $ST_{n+1}$ instead of the following gate signal.

The j-th stage $ST_j$ of FIG. 3 will now be described in more detail.

Referring to FIG. 4, the j-th stage $ST_j$ includes a buffer unit 410, a charging unit 420, a pull-up unit 430, a carry-signal-generating unit 470, a pull-down unit 440, a discharging unit 450, and a holding unit 460. The j-th stage $ST_j$ receives the preceding carry signal $Cout_{(j-1)}$, clock signal CKV, and clock bar signal CKVB as illustrated in FIG. 5. The clock signal CKV includes high-level periods PH_1 and PH_2 and low-level periods PL_1 and PL_2.

Further, as shown in FIG. 4, the buffer unit 410 includes a diode-connected transistor T4. In operation, the buffer unit 410 provides the preceding carry signal $Cout_{(j-1)}$ inputted through the set terminal S to the charging unit 420, carry-signal-generating unit 470, and pull-up unit 430.

The charging unit 420 includes one terminal connected to the source of the transistor T4, pull-up unit 430, and discharging unit 450, and the other terminal connected to the gate output terminal OUT1.

The pull-up unit 430 includes a thin film transistor T1 for driving a gate line. The drain of the thin film transistor T1 is connected to the first clock terminal CK1, the gate of the thin film transistor T1 is connected to the charging unit 420, and the source of the thin film transistor T1 is connected to the gate output terminal OUT1. Also, the pull-up unit 430 includes a parasitic capacitor C3 and a ripple-prevention capacitor C4. The parasitic capacitor C3 is formed between the drain and the gate of the transistor T1. According to an exemplary embodiment, the parasitic capacitor C3 may be a capacitor unintentionally formed in a process of manufacturing the transistor T1. One terminal of the ripple-prevention capacitor C4 is connected to the drain of the transistor T1, and the other terminal thereof is connected to the common voltage terminal Vcom. A DC voltage may be applied to the other terminal of the ripple-prevention capacitor C4 in addition to the common voltage Vcom. Details of the parasitic capacitor C3 and the ripple-prevention capacitor C4 will be described later.

The carry-signal-generating unit 470 includes a transistor T15 having a drain connected to the first clock terminal CK1, a source connected to the carry output terminal OUT2, a gate connected to the buffer unit 410, and a capacitor C2 connected between the gate and the source of the transistor T15.

The pull-down unit 440 includes a transistor T2 having a drain connected to the source of the transistor T1 and the other terminal of the charging capacitor C1, a source connected to the supply voltage terminal GV, and a gate connected to the reset terminal R.

The discharging unit 450 includes a transistor T9 having a gate connected to the reset terminal R, a drain connected to one terminal of the charging capacitor C1, and a source connected to the supply voltage terminal GV, and discharging the charging unit 420 in response to the gate signal $Gout_{(j+1)}$ of the following stage $ST_{j+1}$, and a transistor T6 having a gate connected to the frame reset terminal FR, a drain connected to one terminal of the capacitor C3, and a source connected to the supply voltage terminal GV, and discharging the charging unit 420 in response to the initialization signal INT.

The holding unit 460 includes a plurality of transistors T3, T5, T7, T8, T10, T11, T12, and T13. If the gate signal $Gout_{(j)}$ is changed from a low level to a high level, the holding unit 460 holds a high-level state, and after the gate signal $Gout_{(j)}$ is changed from the high level to the low level, it holds the gate signal $Gout_{(j)}$ at a low level for one frame irrespective of the voltage level of the clock signal CKV and the clock bar signal CKVB.

The operation of the above-described units will now be described in detail with reference to FIGS. 4 and 5.

An operation in which the gate signal $Gout_{(j)}$ is changed from the gate-off voltage Voff to the gate-on voltage Von will be described.

The charging unit 420 receives the preceding carry signal $Cout_{(j-1)}$ as illustrated in FIG. 5, and performs a charging operation. For example, as the charging unit 420 receives the preceding carry signal $Cout_{(j-1)}$ at the first low level period PL_1 and is charged, the voltage at node N1 is gradually increased. As the high-level clock signal CKV is outputted as the gate signal $Gout_{(j)}$, the voltage at node N1 is boosted up by a parasitic capacitor C3 formed between the drain and the gate of the transistor T1.

If the voltage of the charging unit 420, i.e., the voltage at node N1, rises to a positive voltage, the transistor T1 of the pull-up unit 430 is fully turned on to provide the clock signal CKV inputted through the first clock terminal CK1 to the gate output terminal OUT1 as the gate signal $Gout_{(j)}$. That is, the gate signal $Gout_{(j)}$ becomes the gate-on voltage level Von. Also, the transistor T15 of the carry-signal-generating unit 470 is turned on, to output the clock signal CKV through the carry output terminal OUT2 as the carry signal $Gout_{(j)}$.

In contrast, if the gate signal $Gout_{(j)}$ becomes the gate-on voltage level Von, the transistors T8 and T13 are turned on. The transistor T13 turns off the transistor T7 to intercept the high-level clock signal CKV being provided to the transistor T3, and the transistor T8 turns off the transistor T3. Accordingly, the transistors T8 and T13 prevents the transistor T3 from pulling down the gate signal $Gout_{(j)}$ to the gate-off voltage level Voff.

The operation in which the gate signal is changed from the gate-on voltage Von to the gate-off voltage Voff is described in the following.

First, the preceding carry signal Cout$_{(j-1)}$ is described. The level of the carry signal Cout(j−1) is same as the level of the clock bar signal CKVB during the first low-level period PL_1. During the first high-level period PH_1, the transistor T15 (not shown) of the previous stage STj−1 and the transistor T11 of the j-th stage STj are turned off so that the carry output terminal OUT2 (not shown) of the previous stage STj−1 is floating. Hence, the level of the carry signal Cout(j−1) may be maintained substantially at a high voltage level during the first high-level period PH_1. During the second low-level PL2, transistor T11 is turned on and the carry output terminal OUT2 (not shown) of the previous stage STj−1 is connected with the node N1 of the j-th stage STj. That is, the level of the carry signal Cout(j−1) may be the same as the level of the node N1. Therefore, the carry signal Cout(j−1) may decrease as shown in FIG. 5.

When the clock signal CKV is shifted from high level to low level in the second low-level period PL_2, the voltage at node N1 is dropped by the parasitic capacitor C3. At this time, as the gate signal Gout$_{(j+1)}$ of the following stage becomes high, the transistor T9 of the charging unit 450 is turned on to provide the gate-off voltage Voff to the node N1. However, since the clock bar signal CKVB is shifted from low level to high level, the transistor T11 of the holding unit 460 is turned on to provide the preceding carry signal Cout$_{(j-1)}$ of a positive voltage to the node N1, so that the gate-off voltage Voff is not abruptly dropped, but is gradually decreased as shown in FIG. 5.

That is, when the gate signal Gout$_{(j+1)}$ of the following stage becomes high, the transistor T1 of the pull-up unit 430 is not turned off, but outputs the low-level clock signal CKV as the gate signal Gout$_{(j)}$. Also, when the gate signal Gout$_{(j+1)}$ of the following stage becomes high level, the transistor T2 of the pull-down unit 440 is turned on to provide the gate-off voltage Voff to the gate output terminal OUT1. Since the pull-down unit 440 drops the gate signal Gout$_{(j)}$ to the gate-off voltage level Voff and the pull-up unit 430 provides the low-level clock signal CKV as the gate signal Gout$_{(j)}$, the voltage level of the gate signal Gout$_{(j)}$ is rapidly pulled down to the gate-off voltage level Voff. Accordingly, the gate signal Gout$_{(j)}$ does not overlap the gate signal Gout$_{(j+1)}$ of the following stage.

Next, an operation in which the gate signal Gout$_{(j)}$ is kept at the gate-off voltage Voff for a frame after the gate signal is pulled down to the gate-off voltage Voff will be described.

After the gate signal Gout$_{(j)}$ is changed from high level to low level, the transistors T8 and T13 are turned off. If the clock signal is at high level, the transistors T7 and T12 turn on the transistor T3 to keep the gate signal Gout$_{(j)}$ at low level. The transistor T10 is turned on to keep the node N1 at low level. Also, the first clock bar signal CKV is at high level and the transistors T5 and T11 are turned on. The turned-on transistor T5 keeps the gate signal Gout$_{(j)}$ at a low level, and the turned-on transistor T11 keeps the node N1 at a low level.

Also, when the clock signal CKV is shifted from low level to high level or the clock signal CKV is shifted from high level to low level in the second high-level period, a ripple may occur at the node N1 as shown as dotted line in FIG. 5 due to the parasitic capacitor C3, but the ripple-prevention capacitor C4 can prevent the ripple from occurring at the node N1.

Specifically, when the clock signal CKV is shifted from a low level to a high level or the clock signal CKV is shifted from a high level to a low level, charges are provided to the node N2. The charges are distributed to the parasitic capacitor C3 and the ripple-prevention capacitor C4. Accordingly, when the ripple-prevention capacitor C4 is provided, the amount of charge provided to the parasitic capacitor C3 becomes less, and thus the ripple of the node N1 due to the parasitic capacitor C3 is reduced. In the current exemplary embodiment, the common voltage Vcom is applied to the other terminal of the ripple-prevention capacitor C4. According to another exemplary embodiment, a DC voltage, for example, a ground voltage, may be applied to the other terminal of the ripple-prevention capacitor C4.

As described above, since the voltage at node N1 is kept as the ground voltage without any ripple, the transistor T1 is turned off, and thus the first clock signal CKV of a high level is not outputted to the gate output terminal OUT1. Accordingly, the gate signal Gout$_{(j)}$ is kept at high level for one frame.

According to an exemplary embodiment, the j-th stage ST$_j$ may not include the carry-signal-generating unit 470. Therefore, the j-th stage ST$_j$ receives the gate signal Gout$_{(j-1)}$ of the preceding stage ST$_{j-1}$ through the set terminal S instead of the carry signal Cout$_{(j-1)}$ of the preceding stage ST$_{j-1}$.

Figure 7:
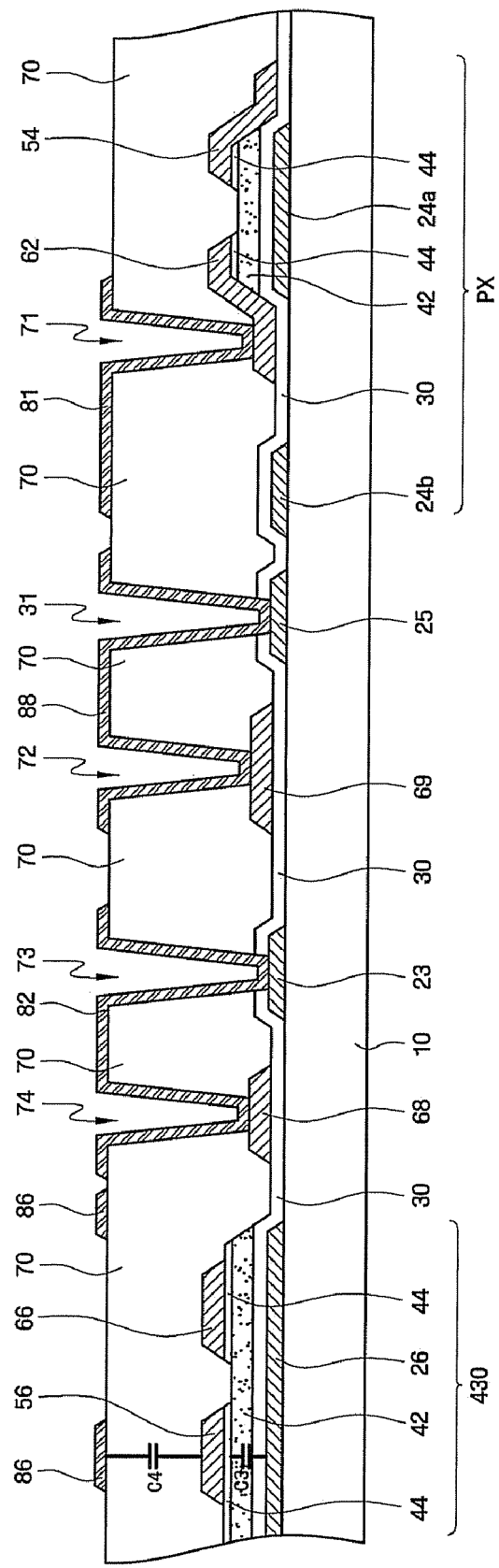
FIG. 7 is a sectional view taken along line A-A' of FIG. 6.

Hereinafter, structures of the transistor T1, the parasitic capacitor C3, and the ripple-prevention capacitor C4 of the pull-up unit 430 will be described in detail with reference to FIGS. 6 and 7. FIG. 6 is a layout diagram of an exemplary embodiment of a pull-up unit of the j-th stage and pixels, and FIG. 7 is a sectional view taken along line A-A′ of FIG. 6. For the sake of convenience in explanation, the layout of an insulating layer, a semiconductor layer, an ohmic contact layer, and a protection layer is omitted.

To prevent confusion, the gate electrode, the drain electrode and the source electrode of the pixel-switching element Qp are called the first gate electrode 26, the first drain electrode 56, and the first source electrode 66, respectively. Also, the gate electrode, the drain electrode and the source electrode of the thin film transistor T1 for driving the gate line are called the second gate electrode 22, the second drain electrode 54, and the second source electrode 62, respectively.

Referring to FIGS. 6 and 7, the first gate electrode 26, a gate line 21, the second gate electrode 22, a gate line contact unit 23, storage electrodes 24a and 24b, and a storage contact unit 25 are formed on an insulating substrate 10 made of transparent glass or plastic.

According to an exemplary embodiment, the insulating substrate 10 may be made of a material having a heat resistance and permeability, for example, transparent glass or plastic. In particular, since plastic has a superior formability and flexibility and is light and inexpensive, it is preferable to use it as the insulating substrate 10.

According to an exemplary embodiment, the first gate electrode 26, for example, may be in the form of a rectangle or a "U" shape. The first gate electrode 26 forms the gate of the thin film transistor T1 for driving the gate line as illustrated in FIG. 4.

The gate line 21 is formed in a horizontal direction, and the second gate electrode 22 is formed to have a specified area. The second gate electrode 22 forms the gate of the pixel-switching element Qp as illustrated in FIG. 2. The gate line contact unit 23 is coupled to the source of a thin film transistor T1.

The storage electrodes 24a and 24b are formed to overlap at least a part of a pixel electrode 81. In the current exemplary embodiment of the present invention, the storage electrodes 24a and 24b are formed along the edge of the pixel electrode 81 and overlap a part of the pixel electrode 81. However, according to an exemplary embodiment, the storage electrodes 24a and 24b are not limited thereto, and may be formed to overlap a center part of the pixel electrode 81. The storage electrodes 24a and 24b receive the common voltage Vcom through the storage contact unit 25. The storage contact unit 25 is coupled to the common voltage line 69. The storage electrodes 24a and 24b overlaps a part of the pixel electrode 81 to form the storage capacitor Cst of FIG. 2.

As described above, the first gate electrode 26, the gate line 21, the second gate electrode 22, the gate line contact unit 23, the storage electrodes 24a and 24b, and a storage contact unit 25 together form a gate pattern. According to an exemplary embodiment, the gate pattern may be made of aluminum series metal such as aluminum (Al) and aluminum alloys, silver series metal such as silver (Ag) and silver alloys, copper series metal such as copper (Cu) and copper alloys, molybdenum series metal such as molybdenum (Mo) and molybdenum alloys, chrome (Cr), titanium (Ti), tantalum (Ta), and so forth. Also, the gate pattern (including elements 21, 22, 23, 24a, 24b, 25 and 26) may have a multilayer structure that includes two conductive layers (having different physical properties. The gate pattern may be formed by coating PEDOT (PolyEthyleneDiOxyThiophene), which is a conductive organic high-polymer series material, through a coating method or by printing the PEDOT through an inject-printing method.

According to an exemplary embodiment, a gate insulating layer 30 is formed on the gate pattern. The gate insulating layer 30 is made of, for example, silicon nitride (SiNx).

On the gate insulating layer 30, a semiconductor layer 42 that overlaps the first gate electrode 26 and the second gate electrode 22 is formed. The semiconductor layer 42 is made of amorphous silicon. Specifically, the semiconductor layer 42 may be made of hydrogenated amorphous silicon, polycrystalline silicon, or conductive organic material. The organic material used for the semiconductor layer 42 may be one selected among pentacene, tetracene, anthracene, naphthalene, alpha-6-tiopen, perylene and its derivatives, rubrene and its derivatives, coronene and its derivatives, perylene tetracarboxylic diimide and its derivatives, peryleme tetracarboxylic dianhydride and it derivatives, polythiopen and its derivatives, polyparaperylenevinylene and its derivatives, polyflorene and its derivatives, and a polythiophenevinylene and its derivatives.

An ohmic contact layer 44 made of a material such as n+ hydrogenated amorphous silicon doped with high-density silicide or N type impurities is formed on the semiconductor layer 42.

A first drain electrode 56 and a first source electrode 66 are formed on the ohmic contact layer 44. The first drain electrode 56 is in the form of a fishbone antenna and is formed to overlap the first gate electrode 26. The first source electrode 66 may be in the form of branches and extend from an outside of the first gate electrode 26 to the first gate electrode 26 and an upper part of the ohmic contact layer 44. The first drain electrode 56 and the first source electrode 66 may be in the form of cross-fingers on the whole. Here, the first drain electrode 56 and the second source electrode 62 form the drain and the source of the thin film transistor T1 for driving the gate line 21. Also, the first drain electrode 56 overlaps a part of the first gate electrode 26 to form the parasitic capacitor C3. The clock signal CKV is inputted through the first drain electrode 56.

The first source electrode contact unit 68 extends from the first source electrode 66, is coupled to a gate line contact unit 23 through a connection electrode 82, and provides a gate signal to the gate line 21. The first source electrode contact unit 68 is widely formed to overlap the first gate electrode 26, and thus, forms the charging capacitor C1 of FIG. 4.

Also, a second drain electrode 54 and a second source electrode 62 are formed on the ohmic contact layer 44. The second drain electrode 54 extends from the data line 52, and the second source electrode 62 is coupled to the pixel electrode 81. The second drain electrode 54 and the second source electrode 62 forms the drain and the source of the pixel-switching element Qp as illustrated in FIG. 2.

A common voltage line 69 is formed on the gate insulating layer 30. The common voltage line 69, as illustrated in FIG. 5, extends vertically, receives the common voltage Vcom from an outside, and provides the common voltage Vcom to the storage electrodes 24a and 24b and a ripple-prevention electrode 86 (described later).

The first source electrode 66, the first source electrode contact unit 68, and the second source electrode 62 form a source pattern, and the first and second drain electrodes 56, 54 form a drain pattern. For example, the source pattern, the drain pattern, and the common voltage line 69 may be formed as a single layer or a multilayer made of aluminum (Al), copper (Cu), silver (Ag), molybdenum (Mo), chrome (Cr), titanium (Ti), tantalum (Ta), or their alloys. For example, they may be, but are not limited to, a single layer made of molybdenum, titanium, and so forth, a double layer made of titanium/aluminum, or a triple layer made of titanium/aluminum/titanium, titanium/aluminum/nitride titanium, molybdenum/aluminum/molybdenum, and so forth.

A protection layer 70 is formed on the source pattern, the drain pattern, and the common voltage line 69. The protection layer 70 includes a first contact hole 74 which exposes a part of the first source electrode contact unit 68, a second contact hole 73 which exposes a part of the gate line contact unit 23, a third contact hole 72 which exposes a part of the common voltage line 69, a fourth contact hole 31 which exposes a part of the storage contact unit 25, and a fifth contact hole 71 that exposes a part of the second source electrode 62. The protection layer 70 is formed of an inorganic material composed of silicon nitride or silicon oxide, an organic material having a superior smoothing characteristic and photosensitivity, or a low-dielectric insulating material such as a-Si:C:O and a-Si:O:F formed by a plasma enhanced chemical vapor deposition ("PECVD"). Also, in order to protect the exposed semiconductor layer 42 while maintaining the characteristics of the organic layer, according to an exemplary embodiment, the protection layer 70 may have a double layer structure composed of a lower inorganic layer and an upper organic layer.

On the protection layer 70, the pixel electrode 81 which is electrically connected to the second source electrode 62 through the fifth contact hole 71 is formed. Also, on the protection layer 70, the connection electrode 82 which electrically connects the first source electrode contact unit 68 with the gate line contact unit 23 through the first contact hole 74 and the second contact hole 73 is formed. Also, the ripple-prevention electrode 86 and the ripple-prevention contact unit 88 are formed on the protection layer 70.

The ripple-prevention electrode 86 overlaps at least a part of the first drain electrode 56 to form a ripple-prevention capacitor C4. Thus, the ripple-prevention electrode 86 may not overlap the first source electrode 66. The ripple-prevention contact unit 88 is coupled to the common voltage line 69 through the third contact hole 72, and provides the common voltage Vcom to the ripple-prevention electrode 86. Also, the ripple-prevention contact unit 88 electrically connects the common voltage line 69 to the storage contact unit 25 through the fourth contact hole 31 to provide the common voltage Vcom to the storage contact unit 25.

According to an exemplary embodiment, the ripple-prevention electrode 86, the ripple-prevention contact unit 88, the connection electrode 82, and the pixel electrode 81 may be formed on the same layer. That is, they may be formed using the same etching mask. Also, according to an exemplary embodiment, the ripple-prevention electrode 86, the ripple-prevention contact unit 88, the connection electrode 82, and the pixel electrode 81 may be made of a transparent conductive material. For example, the ripple-prevention electrode 86, the ripple-prevention contact unit 88, the connection electrode 82, and the pixel electrode 81 may be made of a transparent conductor such as Indium Tin Oxide ("ITO") or Indium Zinc Oxide ("IZO").

As described above, since the ripple-prevention capacitor C4 is connected to the first drain electrode 56 of the thin film transistor T1 for driving the gate line 52, the ripple produced at node N1 by the parasitic capacitor C3 is prevented even if the clock signal CLK is applied to the drain of the thin film transistor T1. Accordingly, the thin film transistor T1 is turned off for a period of a frame, and thus, the display quality can be improved.

Figure 8:
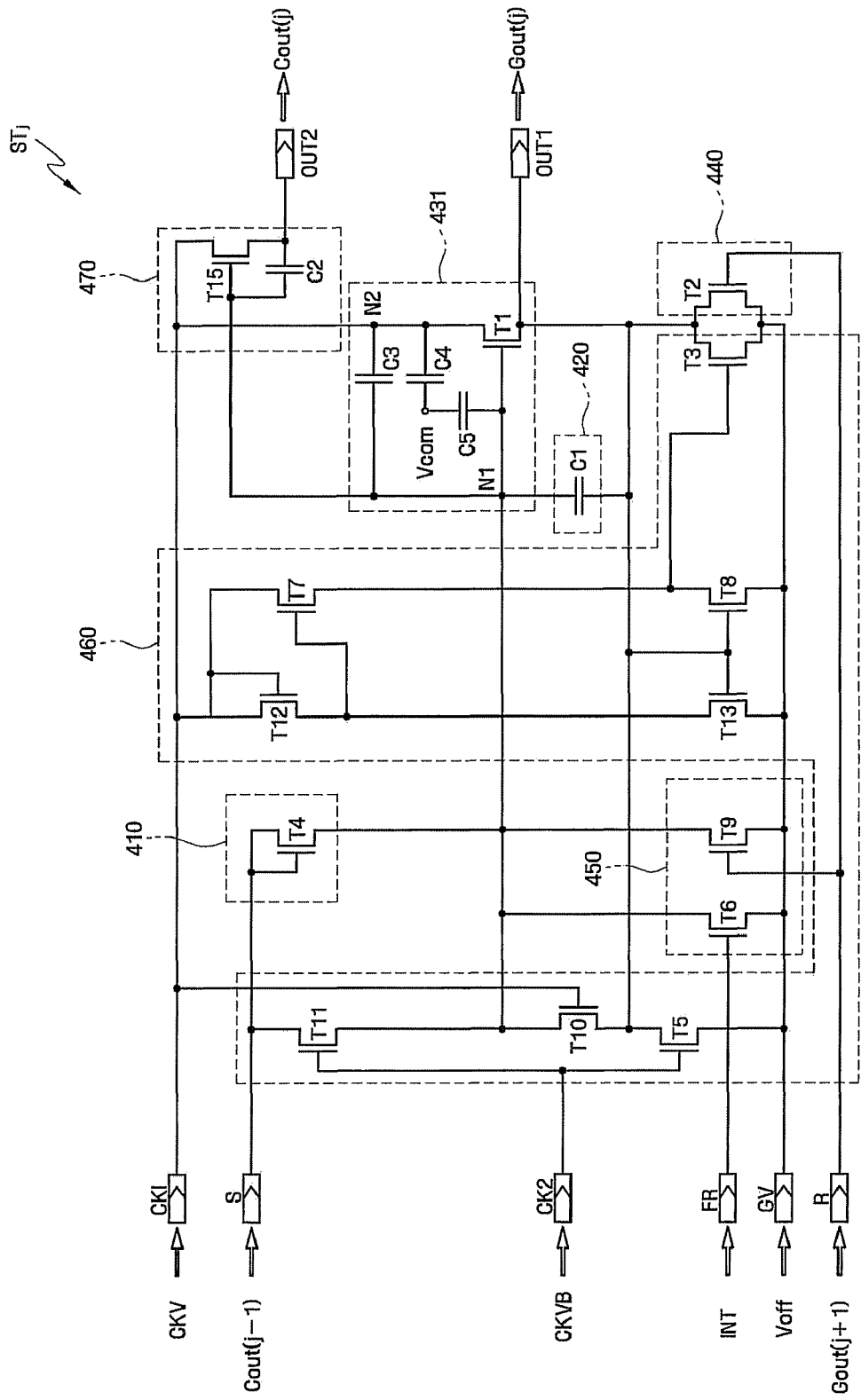
FIG. 8 is a circuit diagram of another exemplary embodiment of a thin film transistor for driving a gate line and a liquid crystal display having the same according to the present invention.
Figure 9:
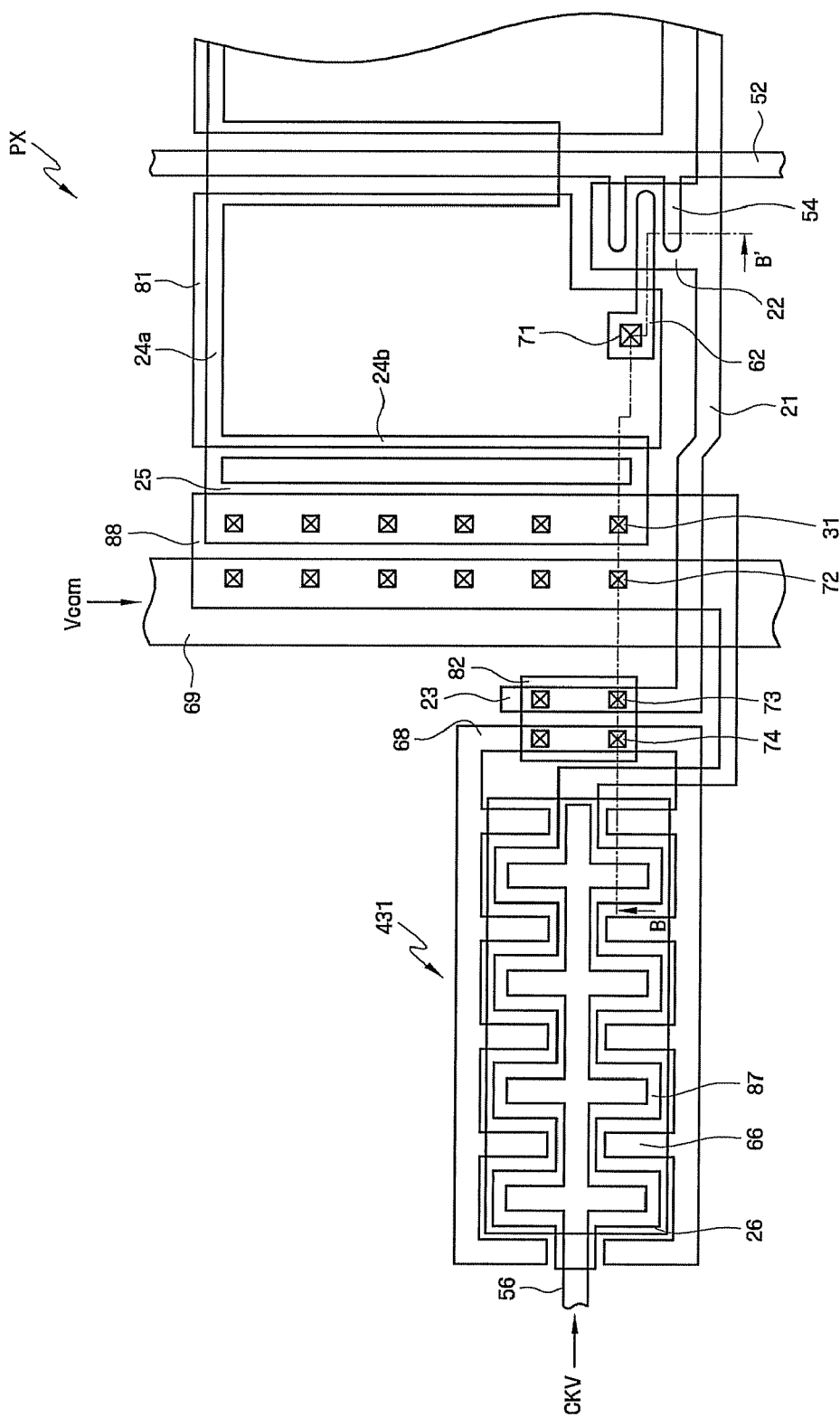
FIG. 9 is a layout diagram illustrating an exemplary embodiment of the pull-up unit of FIG. 8 and pixels according to the present invention.
Figure 10:
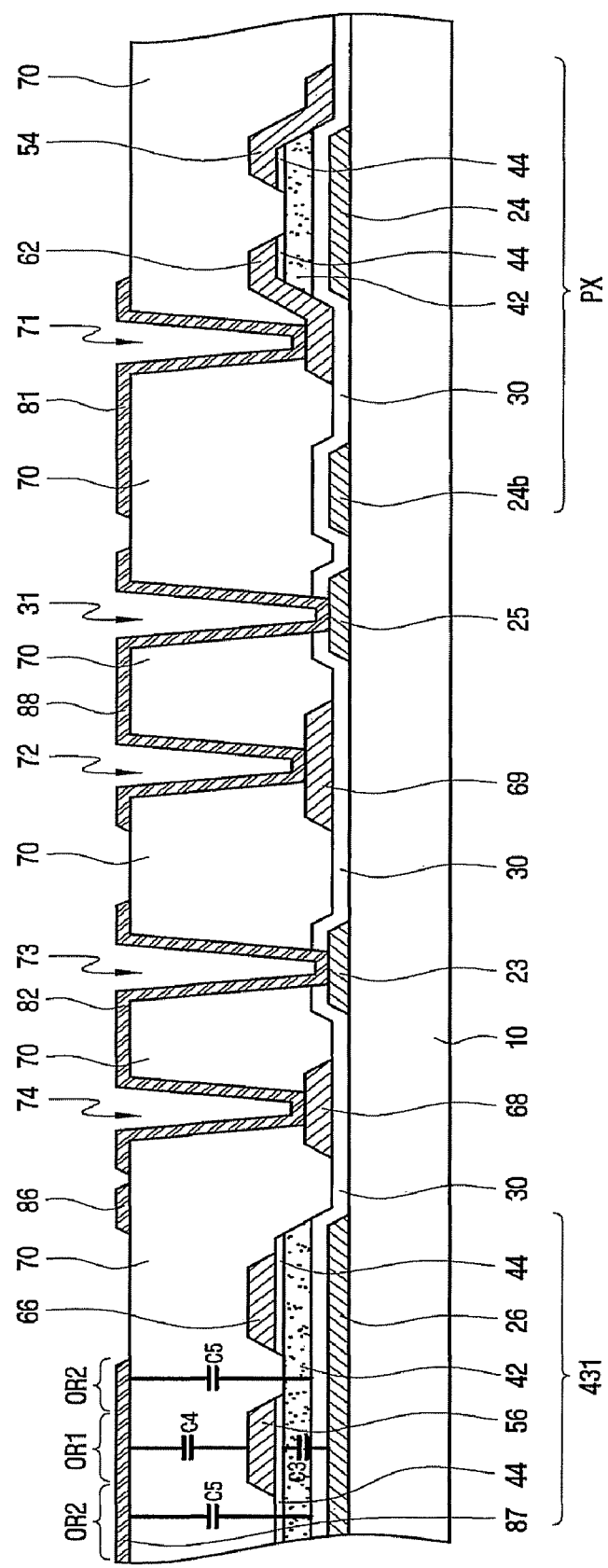
FIG. 10 is a sectional view taken along line B-B' of FIG. 9.

Referring to FIGS. 8 through 10, a thin film transistor for driving a gate line and a liquid crystal display having the same according to another exemplary embodiment of the present invention will be described. FIG. 8 is a circuit diagram of an exemplary embodiment of a thin film transistor for driving a gate line and a liquid crystal display having the same according to another exemplary embodiment of the present invention. FIG. 9 is a layout diagram illustrating an exemplary embodiment of a pull-up unit of FIG. 8 and pixels, and FIG. 10 is a sectional view taken along line B-B' of FIG. 9. The same reference numerals are used for elements having the same function as those illustrated in FIGS. 4, 6, and 7, and therefore, a description of the corresponding elements will be omitted. To prevent confusion, the ripple-prevention capacitor C4 in the above-described embodiment of the present invention is called the first ripple-prevention capacitor C4.

Referring to FIG. 8, a pull-up unit 431 further includes a second ripple-prevention capacitor C5. As shown, one end of the second ripple-prevention capacitor C5 is connected to the gate of the thin film transistor T1 for driving the gate line, and the other end thereof is connected to one end of the first ripple-prevention capacitor C4 to receive the common voltage Vcom. In this case, the second ripple-prevention capacitor C5 can prevent the ripple produced at node N1.

Referring to FIGS. 9 and 10, the ripple-prevention electrode 86 is formed to be wider than the ripple-prevention electrode 86 according to the above-described embodiment of the present invention. That is, the ripple-prevention electrode 86 includes a first overlap region OR1 which overlaps at least a part of the first drain electrode 56, and a second overlap region OR2 which overlaps at least a part of the first gate electrode 26 instead of the first drain electrode 56. In the current exemplary embodiment, the ripple-prevention electrode 86 and the first gate electrode 26 in the second overlap region OR2 form the second ripple-prevention capacitor C5. According to an exemplary embodiment, the first and second overlap regions OR1 and OR2 may not overlap the first source electrode 66.

Figure 11:
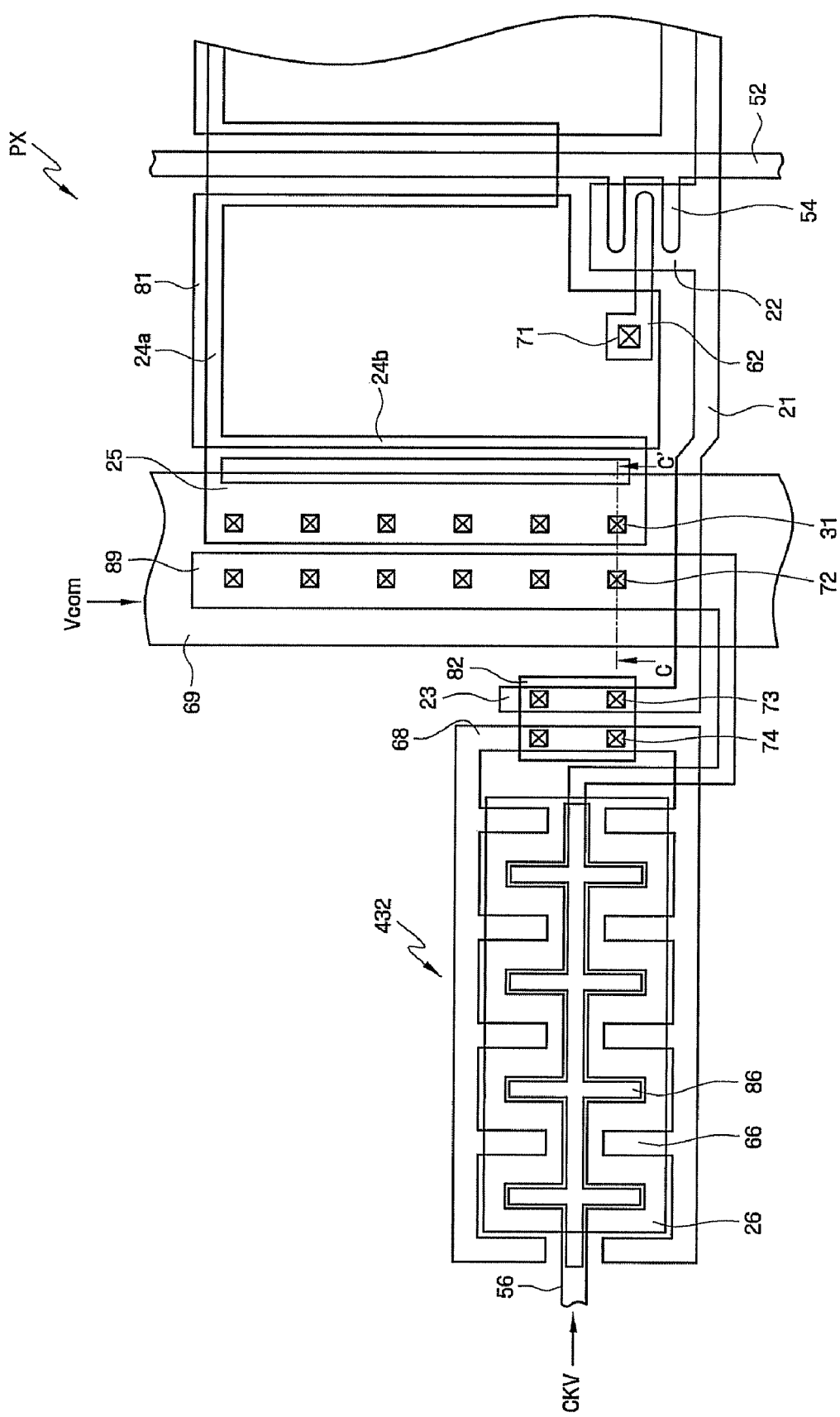
FIG. 11 is a layout diagram of another exemplary embodiment of a thin film transistor for driving a gate line and a liquid crystal display having the same according to the present invention.
Figure 12:
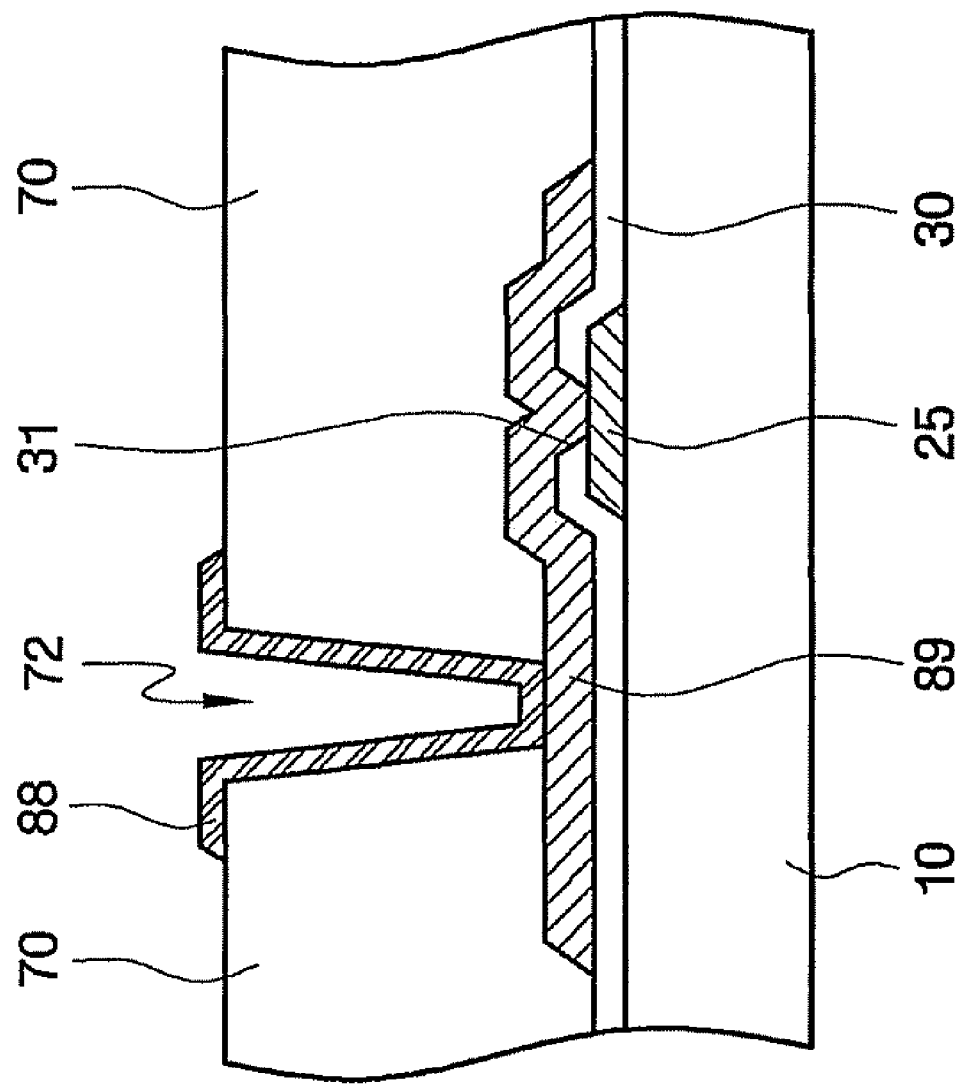
FIG. 12 is a sectional view taken along line C-C' of FIG. 8.

Referring to FIGS. 11 and 12, a thin film transistor for driving a gate line and a liquid crystal display having the same according to still another exemplary embodiment of the present invention will be described. FIG. 11 is a layout diagram of an exemplary embodiment of a thin film transistor for driving a gate line and a liquid crystal display having the same according to still another exemplary embodiment of the present invention, and FIG. 12 is a sectional view taken along line C-C' of FIG. The same reference numerals are used for elements having the same function as those illustrated in FIGS. 6 and 7, and therefore, the description of the corresponding elements will be omitted.

Referring to FIGS. 11 and 12, according to the current exemplary embodiment, a ripple-prevention contact unit 89 of a pull-up driving unit 432 does not make the common voltage line 69 and the storage contact unit 25 coupled to each other. The storage contact unit 25 is directly connected to the common voltage line 69. In the current exemplary embodiment of the present invention, the connection between the common voltage line 69 and the storage contact unit 25 can be diversified. The connection between the common voltage line 69 and the storage contact unit 25 and the connection between the common voltage line 69 and the ripple-prevention contact unit 89 are not limited to those as described above, and may vary as necessary.

Figure 13:
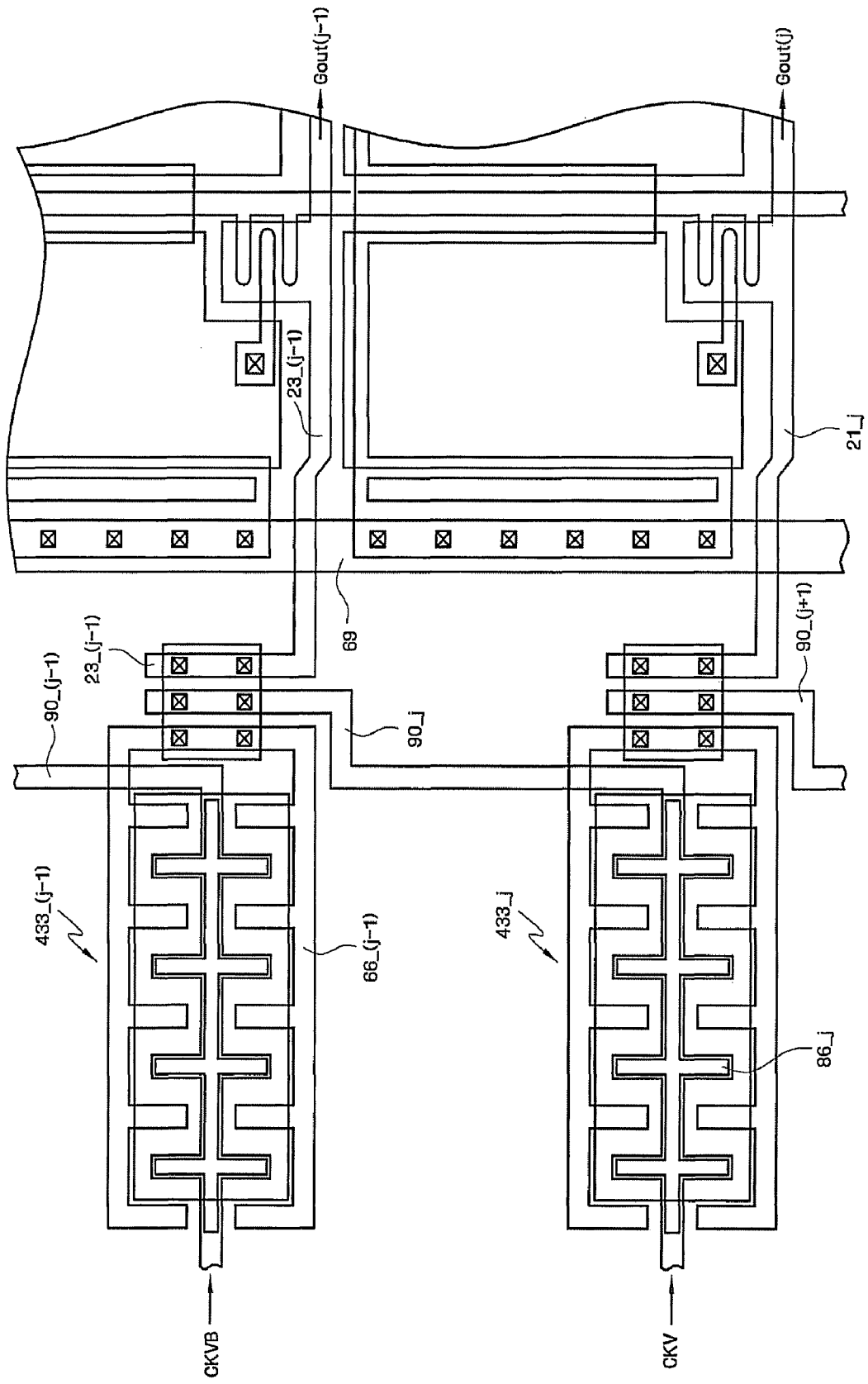
FIG. 13 is a layout diagram of another exemplary embodiment of a thin film transistor for driving a gate line and a liquid crystal display having the same according to the present invention.

A thin film transistor for driving a gate line and a liquid crystal display having the same according to still another exemplary embodiment of the present invention will be described with reference to FIG. 13. FIG. 13 is a layout diagram of an exemplary embodiment of a thin film transistor for driving a gate line and a liquid crystal display having the same. The same reference numerals are used for elements having the same function as those illustrated in FIG. 6, and therefore, the description of the corresponding elements will be omitted. To prevent confusion, "j" is added to the reference numerals of elements of the j-th stage, "(j−1)" is added to the reference numerals of elements of the (j−1)-th stage, and "(j+1)" is added to the reference numerals of elements of the (j+1)-th stage.

As described above, in addition to the common voltage Vcom, a DC voltage having a different voltage level may be received in one end of the ripple-prevention capacitor C4. Accordingly, in the current exemplary embodiment of the present invention, the ripple-prevention electrode 86_j of the pull-up unit of the j-th stage does not receive the common voltage Vcom, but receives the preceding gate signal $Gout_{(j-1)}$. A DC gate-off voltage Voff is received as the preceding gate signal $Gout_{(j-1)}$, except for a specified time in a frame.

For example, the ripple-prevention contact unit 90_j is coupled to the first source electrode 66_(j−1) of the pull-up unit 433_(j−1) of the (j−1)-th stage. That is, the ripple-prevention contact unit 90_j is coupled to the first source electrode 66_(j−1) of the pull-up unit 433_(j−1) of the (j−1)-th stage, the gate line contact unit 23_(j−1), and the common voltage line 69. Although not illustrated in detail, the ripple-prevention contact unit 90_(j+1) of the (j+1)-th state is coupled to the first source electrode 66_j of the j-th stage to receive the gate signal $Gout_{(j)}$. However, the present invention is not limited to the connection structure as illustrated in FIG. 13, but may vary types of connection structures in which the ripple-prevention contact unit 90_j can receive the preceding gate signal $Gout_{(j-1)}$.

While the present invention has been shown and described with reference to some exemplary embodiments thereof, it should be understood by those of ordinary skill in the art that various changes in form and details may be made therein without departing from the spirit and scope of the present invention as defined by the appending claims.

What is claimed is:

1. A thin film transistor for driving a gate line, comprising:
   a gate electrode;
   a semiconductor layer formed on the gate electrode;
   a drain electrode formed on the semiconductor layer;
   a source electrode formed on the semiconductor layer and separated from the drain electrode and being coupled to the gate line; and
   a ripple-prevention electrode formed on the drain electrode which overlaps at least a part of the drain electrode.

2. The thin film transistor of claim 1, wherein the drain electrode and the ripple-prevention electrode form a capacitor.

3. The thin film transistor of claim 1, wherein the ripple-prevention electrode comprises:
a first overlap region which overlaps the drain electrode; and
a second overlap region which overlaps at least a part of the gate electrode without overlapping the drain electrode.

4. The thin film transistor of claim 3, wherein the first and second overlap regions do not overlap the source electrode.

5. The thin film transistor of claim 1, wherein the ripple-prevention electrode is made of a transparent conductive material.

6. The thin film transistor of claim 1, wherein a direct current voltage is applied to the ripple-prevention electrode.

7. The thin film transistor of claim 1, wherein the semiconductor layer is made of amorphous silicon.

8. A liquid crystal display comprising:
a plurality of gate lines; and
a plurality of thin film transistors coupled to the respective gate lines to output a plurality of gate signals, each of the thin film transistors comprising;
a gate electrode;
a semiconductor layer formed on the gate electrode;
a drain electrode formed on the semiconductor layer;
a source electrode formed on the semiconductor layer and separated from the drain electrode, the source electrode being coupled to the respective gate lines to output the gate signals; and
a ripple-prevention electrode formed on the drain electrode which overlaps at least a part of the drain electrode.

9. The liquid crystal display of claim 8, wherein the drain electrode and the ripple-prevention electrode form a capacitor.

10. The liquid crystal display of claim 8, wherein the ripple-prevention electrode comprises:
a first overlap region which overlaps the drain electrode; and
a second overlap region which overlaps at least a part of the gate electrode without overlapping the drain electrode.

11. The liquid crystal display of claim 10, wherein the first and second overlap regions do not overlap the source electrode.

12. The liquid crystal display of claim 8, wherein the ripple-prevention electrode is made of a transparent conductive material.

13. The liquid crystal display of claim 8, further comprising:
a plurality of data lines; and
a plurality of pixel electrodes coupled to the gate lines and the data lines.

14. The liquid crystal display of claim 13, wherein the ripple-prevention electrode and the pixel electrode are made of a transparent conductive material and are formed on a same layer.

15. The liquid crystal display of claim 13, further comprising:
a storage electrode which overlaps at least a part of the pixel electrode;
wherein the ripple-prevention electrode is coupled to the storage electrode.

16. The liquid crystal display of claim 15, wherein a common voltage is applied to the ripple-prevention electrode and the storage electrode.

17. The liquid crystal display of claim 13, further comprising:
a common voltage line which applies a common voltage;
a storage electrode which overlaps at least a part of the pixel electrode;
a protection layer formed on the common voltage line and the storage electrode, and comprising a first contact hole which exposes a part of the common voltage line and a second contact hole which exposes a part of the storage electrode; and
a ripple-prevention contact unit which extends from the ripple-prevention electrode to electrically connect the common voltage line to the storage electrode through the first and second contact holes, and transfer the common voltage to the ripple-prevention electrode.

18. The liquid crystal display of claim 17, wherein the storage electrode, the gate electrode, and the gate line are formed on a same layer; and the ripple-prevention electrode, the ripple-prevention contact unit, and the pixel electrode are formed on a same layer.

19. The liquid crystal display of claim 8, wherein the respective thin film transistor receives a clock signal through the drain electrode, and outputs the clock signal of a high level to the source electrode as a gate signal while a voltage of the high level is applied to the gate electrode.

20. The liquid crystal display of claim 8, wherein the semiconductor layer is made of amorphous silicon.

* * * * *